United States Patent [19]

Wang et al.

[11] Patent Number: 5,180,625

[45] Date of Patent: Jan. 19, 1993

[54] CERAMIC ALUMINUM LAMINATE AND THERMALLY CONDUCTIVE ADHESIVE THEREFOR

[75] Inventors: Mansheng Wang; Bruce A. Given, both of San Diego, Calif.

[73] Assignee: TRW Inc., Redondo Beach, Calif.

[21] Appl. No.: 541,663

[22] Filed: Jun. 21, 1990

Related U.S. Application Data

[63] Continuation of Ser. No. 189,859, May 3, 1989, abandoned.

[51] Int. Cl.$^5$ .............................................. B32B 7/12
[52] U.S. Cl. ..................................... 428/212; 428/215; 428/220; 428/416; 428/457; 428/702; 428/901
[58] Field of Search ............... 428/78, 702, 414, 416, 428/457, 901, 212, 215, 220; 361/402; 156/286, 330; 523/457

[56] References Cited

U.S. PATENT DOCUMENTS

| | | | |
|---|---|---|---|
| 3,305,416 | 2/1967 | Kahan | 156/286 |
| 4,299,873 | 11/1981 | Ogihara | 428/901 |
| 4,524,238 | 6/1985 | Butt | 357/81 |
| 4,866,108 | 9/1989 | Vachon | 428/40 |

FOREIGN PATENT DOCUMENTS 2214650 9/1987 Japan .

OTHER PUBLICATIONS

"Epoxy Resin Adhesives"; Handbook of Adhesives; Skeist; Van Nostrand Reinhold; NY; 1990; pp. 347–358.
"Phenolic Resin Adhesives"; Handbook of Adhesives; Skeist; Van Nostrand Reinhold; NY; 1990; pp. 316–340.
"Master Bond Polymer Adhesive Ep21AOHT" Technical Data Sheet undated.
"Eccobond 45" Technical Bulletin; Emerson and Cuming; 1985.
Material Safety Data Sheet; U.S. Dept. of Labor; EP2-1AOHT-1; undated.
"Master Bond Polymer Adhesive" EP21TDCAOHT; Technical Data Sheet; undated.
"Novolac"; Hawley's Condensed Chemical Dictionary; Eleventh Edition; Sax and Lewis; Van Nostrand Reinhold; NY; undated; p. 840.

*Primary Examiner*—Jenna L. Davis
*Attorney, Agent, or Firm*—G. Gregory Schivley; Ronald L. Taylor

[57] ABSTRACT

A 5½" by 5¾" flat ceramic board is bonded to an aluminum frame which serves as a heat sink. The bonding agent intermediate the board and the frame is thermally conductive and comprises an epoxy containing Master Bond EP21TDCAOHT. The formed laminate or bond is capable of withstanding repeated stresses occurring through thermal cycling in temperatures from −60 degrees centigrade to +125 degrees centigrade and vibration and humidity testing.

5 Claims, 1 Drawing Sheet

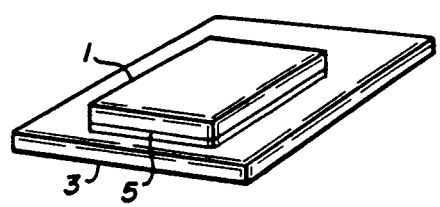
Fig_1
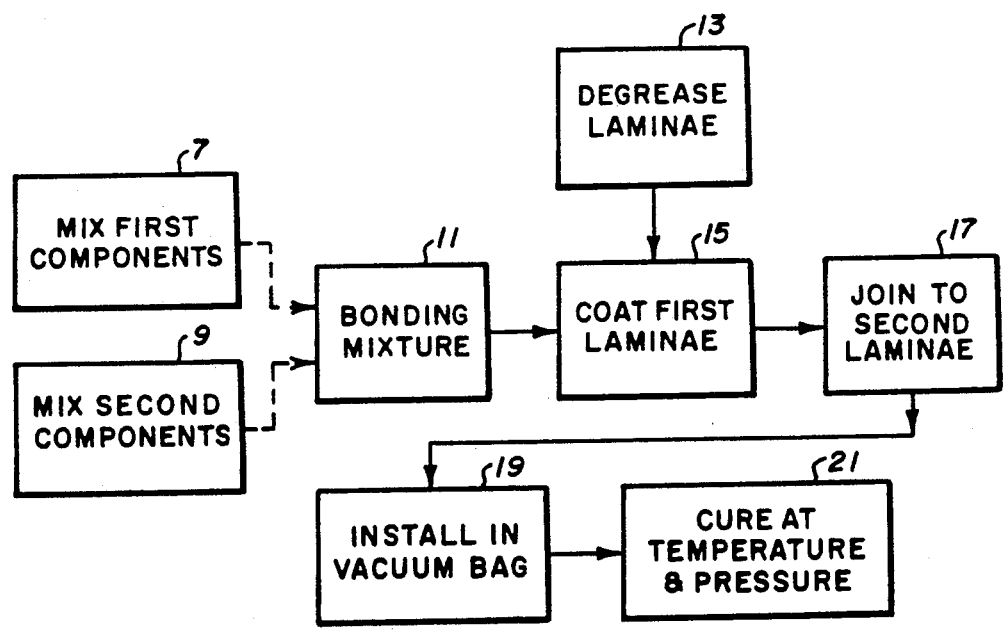
Fig_2

CERAMIC ALUMINUM LAMINATE AND THERMALLY CONDUCTIVE ADHESIVE THEREFOR

The present application is a continuation of application Ser. No. 07/189,859 filed May 3, 1989, now abandoned.

FIELD OF THE INVENTION

This invention relates to a core bond between ceramic and aluminum materials whereby the aluminum is in thermally conductive relationship with the ceramic and serves as a "heat sink" for heat generated in the ceramic. The invention also relates to the formed ceramic aluminum laminate, the process of fabricating the laminate, and to a novel thermally conductive adhesive used in the process and laminate.

BACKGROUND

Ceramic packages are used to hold the semiconductor devices and associated circuits used in various electronic apparatus. The ceramic serves as a printed circuit board. In the operation of the semiconductor heat is generated by dissipation of electrical energy in the p-n junctions and, unless the heat is removed, the transistor temperature may rise to destructive levels. The heat must be transferred from the locale of the semiconductor to an external sink, referred to as a "heat sink", so as to prevent a build up of the temperature of the semiconductor, maintaining the semiconductor below the temperature at which destructive thermal runaway occurs.

One known material used as a heat sink is aluminum. The aluminum sheet is connected to the ceramic for the purpose of providing a thermally conductive passage. The large surface area of the aluminum sheet allows the heat to be conducted away to the ambient air or by additional thermally conductive connections to other cooling equipment. In the past the laminates formed of the ceramic board and the aluminum sheet used silicone as the bonding adhesive. Silicone provides an excellent bond between the ceramic and aluminum; one that is strong, is thermally conductive and is capable of meeting requirements of temperature cycling, vibration, humidity and resisted degradation when exposed to solvents, such as isopropyl and acetone, although some silicones degrade after a long term of exposure to MEK, 1,1,1 trichloroethane. However, the silicone adhesive has some disadvantage. Silicone generally requires a primer, such as ECCOSIL Primer S-11, which consists of 25% of polydimethyl Siloxane and 75% of VMP Naphtha to improve adhesion to non-silicone materials such as the ceramic and the aluminum. They require special manufacturing procedures to prevent contamination of the surrounding environment, such as vapor degreasers and surrounding materials such as solder paste; they require long curing times and "rework", the process of disassembling the laminate and then reassembling as might be required to repair a semiconductor within the ceramic package, is difficult and costly. Although substitutes such as adhesives available in the market place were tried, none appeared to be satisfactory with laminates of ten square inches or larger.

An object of the invention is to provide a silicone free substitute for the silicone bonding agent in a ceramic aluminum laminates. A further object of the invention is to provide a ceramic aluminum laminate in which the bonding agent does not contains silicones and possesses good thermal conductivity characteristics. A still further object of the invention is to provide a method of assembling a ceramic printed circuit board to an aluminum heat sink without the use of silicones using ingredients that are available on the market. An additional object of the invention is to provide a ceramic aluminum laminate structure of an area of ten square inches or greater that withstands temperature cycling over a range of −60 degrees centigrade to +125 degrees centigrade for at least 100 cycles, without breaking or bending. It is a still additional object of the invention to provide a thermally conductive adhesive to bond ceramic to aluminum and in which the bond is reworkable.

SUMMARY OF THE INVENTION

A laminate of greater than ten square inch area is formed of a ceramic board and an aluminum sheet by inclusion intermediate the board and sheet of an epoxy adhesive layer. The epoxy contains a polyamide hardener, an epoxy "Novolac" resin, a flow control agent, and fused alumina. A thermally conductive adhesive according to the invention is formed of a mixture containing Master Bond EP21TDCAOHT formed by mixing one part by weight of Master Bond EP21TDCAOHT and one part hardener by weight to form a first mixture element; mixing one part by weight "Eccobond 45" and one part by weight catalyst to form a second mixture element; and mixing one part by weight of said first element with one part by weight of said second element to form said adhesive mixture.

In the process a surface of a flat ceramic board is coated with at least a portion of said adhesive mixture to form a layer over that board surface, the board surface coated having an area greater than ten square inches, said layer being approximately 12 mils in thickness. The adhesive coated surface is placed in contact with the surface of an aluminum sheet to form an assembly. The assembly is then placed in a vacuum bag to maintain said elements of said assembly at a predetermined contact pressure and a predetermined temperature. That pressure and temperature are maintained for a predetermined time to cure said adhesive, resulting in the bonded ceramic board and aluminum layer.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DESCRIPTION OF THE DRAWINGS

In the drawings:

FIG. 1 illustrates a section view of a laminate according to the invention; and

FIG. 2 illustrates the method of forming the laminate according to the novel process.

DETAILED DESCRIPTION

The laminate illustrated in FIG. 1 is formed of a ceramic layer 1, suitably aluminum oxide, a layer of metal 3" suitably an aluminum sheet, and a layer of the bonding adhesive 5, discussed in detail hereinafter and which is silicone free. For convenience of illustration the layers are not illustrated to scale. Bonding layer 5 holds the laminate together and provides a thermally conductive path from the ceramic layer to the aluminum. The surface area of contact is greater than ten square inches.

By way of specific example, the ceramic layer measured approximately 5" by 5½" in length and width, which is over ten square inches in area, and was 0.055 inches in thickness, which is a relatively thin wafer. The aluminum layer covered a much larger area and was also fairly thin, measuring approximately 0.056 inches in thickness. As those skilled in the art appreciate the individual laminae or layers may be the same size and area or be of a different size and area, the latter of which is illustrated in th first figure.

Reference is made to FIG. 2, which shows an embodiment of the process. In this process a mixture of two adhesive mixtures are formed. The first element of the mixture was prepared by taking one part by weight of Master Bond EP21TDCAOHT and one part by weight of the hardener and mixing them as represented by block 7; then a portion of Eccobond 45 was taken in one part by weight and added to one part by weight of the Eccobond 45/Catalyst 15 and the elements were mixed as represented at 9; thereafter one part of the first element was taken and mixed with one part by weight of the second element to form the bonding agent or mixture, as variously termed, represented at 11.

Polymer adhesive Master Bond EP21TDCAOHT is an adhesive made available by Master Bond, Inc., a company located in Hackensack, N.J. That product is stated to generally contain the various known elements in the percentage by weight as follows: a pigment "grey" 5%; a catalyst "amine functional polybutadiene blend" 16%; a vehicle "liquid epoxy Novolac Resin" 16%; additives alumina fused 60%; and a flow control agent 3%; the exact details of which appears to be proprietary according to a material safety data sheet available from the U.S. Department of Labor OSHA and are not known to the applicants.

Eccobond 45 is a trade name for a bonding agent as made available by the Emerson and Cuming, Inc. Company of N.J. This is used in conjunction with Eccobond 45/Catalyst 15 to provide a medium viscosity room temperature curing epoxy system that has the capability of being rapidly cured at elevated temperatures according to the technical data sheet of that company.

It is recognized that a single adhesive or bonding agent may become available for use in the process and in the laminate construction, which is equivalent to the foregoing mixture. With such a substitute, the first two steps of the process described may be eliminated; the process would start as at block 11. For example, there is another adhesive made available by the Master Bond Company as part number or under the trade name EP21AOHT-1.

The laminae are then degreased as represented at step 13. The ceramic board and the aluminum frame is treated with a vapor degreaser using FREON-TMS as degreasing agent to remove any grease. The surfaces are then treated with Isopropyl Alcohol to further clean those surfaces.

A thin layer approximately 12 mils in thickness of the adhesive bonding material mixture is then applied over a 5" by 5½" surface of the ceramic board, as represented by block 15. A spatula or rubber squeegee is useful for applying the adhesive. The board and the frame are then pressed together as at step 17 and the assembly is placed in a conventional vacuum bag, represented at 19, and the contact pressure between the board and frame applied in the vacuum bag is adjusted to five pounds per square inch. The environment is raised to a temperature of 121 degrees centigrade and the assembly is held at this temperature and contact pressure described for approximately forty-five minutes. This cures the adhesive mixture, as represented at block 21, and forms the laminate.

If desired the process may be modified by placing strips of KAPTON film around the periphery of the ceramic board. The film prevents the adhesive from spreading to that peripheral area when the two parts of the laminate are pressed together during assembly. Suitably the strips are on the order of 1/16th of an inch in width and 0.0105 inches thickness.

In this enhancement after the layer of adhesive is applied to the ceramic surface, the KAPTON films are removed to expose a bare portion providing a frame about the remainder of the resin layer. When the ceramic wafer is pressed against the aluminum sheet in the process described, the resin spreads out into this bare area. The use of the KAPTON films thus avoids including too much resin as might be forced to squirt out the sides of the laminate during the curing process.

It was discovered that the laminate so formed withstood thermal cycling, vibration and humidity testing to mil standard 810° C.; that is, the board temperature was raised to +125 degrees C. and then lowered to −60 degrees C. This process was repeated one-hundred times. The laminate withstood that cycling without breaking and/or permanently deforming. Further the assembly was found to have satisfactory thermal conduction properties; that is, the heat applied to the ceramic passed through the bonding agent to the aluminum sheet to a degree useful for semiconductor devices.

At the time of this discovery, the Master Bond EP21TDCAOHT adhesive was known to be of a thermally conductive characteristic. However, it was found to be too stiff and in the applicant's experiments that adhesive could not satisfactorily meet temperature cycling requirements between −60 degrees C. to 125 degrees C. Furthermore at the time Eccobond 45 material was known to be flexible but, however, was not thermally conductive. To applicant's surprise by combining the two elements, a thermally conductive bonding agent was created that withstands the required temperature cycling. The mechanisms or theory by which this combination of essentially dissimilar adhesives provides the discovered desirable result is not understood by the applicants, and may be studied by others who given this disclosure may open new doors in scientific exploration.

Given the discovery of the superior adhesive quality of the mixture of separate adhesive as described, "Master Bond EP21TDCAOHT" and "Eccobond 45" adhesives, a sample was given to the supplier of one of the adhesive components, Master Bond, Inc. accompanied by the description of favorable characteristics of that mixture. That organization then provided a variation to their existing adhesive, part number EP21AOHT, which is referred to as part number EP21AOHT-1.

It was determined that the substitution of this other adhesive EP21AOHT-1 within the laminate and the method provided performance that was roughly equivalent in all material respects, and had a higher thermal conductivity, one which measured 7 BTU inch per hour foot squared degrees Fahrenheit.

A comparison of the physical properties of the two materials for the bonding agent mixture are as follows:

| | EP21 AOHT-1 | ORIGINAL MIXTURE |
|---|---|---|
| 1) Specific Gravity (gms/cc) | 2.2 | 1.63 |
| 2) Viscosity @ 75° F. (cps) | 49,200 | 37,000 |
| 3) Working life after mixing @ 75° F. (hrs) | 3 | 3 |
| 4) Hardness, Shore A | 80 | 70 |
| 5) Volume Resistivity @ 75° F. (ohm-cm) | $10^{14}$ | $3 \times 10^{13}$ |
| 6) Dielectric Strength (volts/mil) | 410 | 400 |
| 7) Dielectric Constant @ 1 MHz | 3.2 | 3.1 |
| 8) Dissipation Factor @ 1 MHz | 0.040 | 0.035 |
| 9) Thermal Conductivity (BTU-in/hr. ft.$^2$ °F.) | 7 | 3 |
| 10) Coefficient of Thermal Expansion (per °F.) | $68 \times 10^{-6}$ | $73 \times 10^{-6}$ |
| 11) Young's Modules, Tensile (psi) | 300,000 | 290,000 |
| 12) Tensile Strength (psi) | 5800 | 6100 |
| 13) Tensile Elongation (%) | 2.8 | 4.3 |
| 14) Tensile Lap Shear Strength | | |
| (psi) @ 75° F. | 3120 | 2970 |
| @ −75° F. | 2893 | 2655 |
| 15) Solvent Resistance, IPA, Freon (Hardness Measurement) | | No difference |

Generally thermal stresses are unavoidable as a result of the fabrication of composite laminate. This is caused by a temperature change on the order of 100 degrees or so; between the high curing temperatures usually used for curing the adhesive that bonds the layers of the laminate together and room temperature. Since a laminate is fabricated so that it acts as a single layer of material, thermal stresses are naturally internally induced because the individual laminae are linked together mechanically and are not free to separately expand or contract as the temperature changes. Thus each laminae influences the expansion or contraction of the other because their coefficients of thermal expansion are different.

Commercially available thermally conductive epoxies, which generally were incorporated with metal oxides or other fillers, worked satisfactorily in applications requiring a bond between the electronic components or parts to the printed circuit board, such as the ceramic board. However, these kinds of epoxy adhesives did not survive thermal cycling tests if the bonding area was large, that is, larger than 10 square inches, if other parameters affecting the magnitude of thermal stresses, such as Young's modulus and the Shear modulus were not considered at the time the adhesives were formulated.

The thickness as well as several inherent physical properties of adhesive, such as Young's Modulus, Shear Modulus, Poisson Ratio, and Linear coefficient of thermal expansion, affect the level of induced thermal stress. One value of this invention was to evaluate those factors and introduce a flexible thermally conductive epoxy to bond ceramic printed wiring board to an aluminum frame that survived various kinds of environment tests elsewhere herein specified.

The laminae and the process disclosed appears to satisfy the need for bonded ceramic aluminum laminae in the range of ten square inches and greater. The board is reworkable. That is, the bond may be loosened by the use of appropriate solvent chemicals without damaging the aluminum or ceramic. . The two laminae may then be reprocessed and formed again into a unitary assembly.

It is believed that the foregoing description of the preferred embodiment of the invention is sufficient in detail to enable one skilled in the art to make and use the invention. However, it is expressly understood that the details of the elements which are presented for the foregoing enabling purpose is not intended to limit the scope of the invention, in as much as equivalents to those elements and other modifications thereof, all of which come within the scope of the invention, become apparent to those skilled in the art upon reading this specification. Thus the invention, is to be broadly construed within the full scope of the appended claims.

What is claimed is:

1. A reworkable silicone free heat sinked ceramic circuit board having a surface of an area of at least ten square inches and capable of withstanding temperature cycling in the range of −60° C. to 125° C., vibration and humidity without delaminating, comprising:
    a flat ceramic board having a surface of an area of at least ten square inches;
    a flat aluminum sheet having a surface area sufficient in size and geometry to at least cover said surface of said ceramic circuit board;
    an epoxy adhesive intermediate said board and said sheet;
    said epoxy adhesive holding said board and said sheet together and forming therewith a laminate and said epoxy adhesive being of sufficient flexibility characteristic to prevent delamination due to thermal stress at all temperatures within the range of −60 degrees Centigrade and 125 degrees Centigrade and being thermally conductive for permitting transfer of heat between said ceramic board and said aluminum sheet and having a dielectric constant of at least 3 at 1 MHz with said epoxy adhesive having the characteristics as follows: Hardness, Shore A of at least 70; Volume Resistivity @ 75° F. (ohm-cm) of at least $3 \times 10^{13}$; Dielectric Strength (volts/mil) of at least 400; Dielectric Constant @ 1 MHz of at least 3.1; Thermal Conductivity (BTU-in/hr. ft.$^2$ °F.) of at least 3; Coefficient of Thermal Expansion (per °F.) of not more than $73 \times 10^{-6}$ and Young's Modulus, Tensile of at least 290,000.

2. The invention as defined in claim 1 wherein said ceramic board is of a thickness of approximately 0.055 inches and wherein said aluminum sheet is of a thickness of approximately 0.056 inches.

3. The invention as defined in claim 1 wherein said epoxy adhesive consists essentially of:
    a polyamide hardener, 16% by weight;
    an epoxy novolac resin, 16% by weight;
    a flow control agent, 3% by weight; and
    fused alumina, 60% by weight.

4. The invention as defined in claim 1 wherein said epoxy adhesive layer is of a thickness of approximately 16 mils.

5. The invention as defined in claim 1 wherein said epoxy adhesive consists essentially of:
    a polyamide hardener;
    an epoxy novolac resin;
    a flow control agent; and
    fused alumina.

* * * * *